US 6,605,519 B2

(12) United States Patent
Lishan

(10) Patent No.: US 6,605,519 B2
(45) Date of Patent: Aug. 12, 2003

(54) METHOD FOR THIN FILM LIFT-OFF PROCESSES USING LATERAL EXTENDED ETCHING MASKS AND DEVICE

(75) Inventor: David G. Lishan, Clearwater, FL (US)

(73) Assignee: Unaxis USA, Inc., Petersburg, FL (US)

( * ) Notice: Subject to any disclaimer, the term of this patent is extended or adjusted under 35 U.S.C. 154(b) by 0 days.

(21) Appl. No.: 09/846,214

(22) Filed: May 2, 2001

(65) Prior Publication Data

US 2002/0164884 A1 Nov. 7, 2002

(51) Int. Cl.$^7$ ................. H01L 21/22; H01L 21/38
(52) U.S. Cl. ............... 438/555; 438/149; 438/167; 438/305; 438/315; 438/319; 438/571; 438/597; 438/622; 438/623; 438/670; 438/692; 438/696; 438/624; 438/951
(58) Field of Search ................. 438/555, 951, 438/696, 597, 571, 670, 305, 624, 167, 704, 315, 319, 692, 623, 622, 149, 701; 430/316, 313, 312, 315, 5, 314, 326, 330; 257/194, 471, 678

(56) References Cited

U.S. PATENT DOCUMENTS

| | | | |
|---|---|---|---|
| 4,209,349 A | | 6/1980 | Ho et al. |
| 4,803,181 A | | 2/1989 | Buchmann et al. |
| 4,921,778 A | | 5/1990 | Thackeray et al. |
| 4,963,501 A | * | 10/1990 | Ryan et al. ............ 438/183 |
| 5,116,715 A | * | 5/1992 | Roland et al. ........... 430/190 |
| 5,116,774 A | | 5/1992 | Huang et al. |
| 5,124,270 A | | 6/1992 | Morizuka |
| 5,171,718 A | * | 12/1992 | Ishibashi et al. ... 148/DIG. 100 |
| 5,240,878 A | * | 8/1993 | Fitzsimmons |
| | | | et al. ............... 148/DIG. 100 |
| 5,250,375 A | * | 10/1993 | Sebald et al. ............. 430/8 |
| 5,252,500 A | | 10/1993 | Sato |
| 5,283,448 A | | 2/1994 | Bayraktaroglu |

(List continued on next page.)

FOREIGN PATENT DOCUMENTS

| | | |
|---|---|---|
| EP | 0 364 740 A2 | 4/1990 |
| JP | 2000-133636 * | 5/2000 |

OTHER PUBLICATIONS

El–Kareh, Badih, Fundamentals of Semiconductor Processing Technologies, Kluwer, 1995, pp. 274–276, 320–324, 560–561.*

"Hole Patterns Reduced", R&D Magazine, pp. 145–146, Sep. 2000.

*Primary Examiner*—Michael S. Lebentritt
*Assistant Examiner*—Michael K. Luhrs
(74) *Attorney, Agent, or Firm*—Foley & Lardner

(57) ABSTRACT

A method for forming an etching mask structure on a substrate includes etching the substrate, laterally expanding the etching mask structure, and depositing a self-aligned metal layer that is aligned to the originally masked area. The etching can be isotropic or anisotropic. The self-aligned metal layer can be distanced from the original etching masked area based on the extent of the intentionally laterally expanded etching mask layer. Following metal deposition, the initial mask structure can be removed, thus lifting off the metal atop it. The etching mask structure can be a resist and can be formed using conventional photolithography materials and techniques and can have nearly vertical sidewalls. The lateral extension can include a silylation technique of the etching mask layer following etching. The above method can be utilized to form bipolar, hetero-bipolar, or field effect transistors.

4 Claims, 10 Drawing Sheets

U.S. PATENT DOCUMENTS

| | | | |
|---|---|---|---|
| 5,411,632 A | | 5/1995 | Delage et al. |
| 5,512,496 A | | 4/1996 | Chau et al. |
| 5,556,812 A | * | 9/1996 | Leuschner et al. ........... 437/209 |
| 5,679,608 A | * | 10/1997 | Cheung et al. ............. 437/195 |
| 5,702,975 A | | 12/1997 | Yoon et al. |
| 5,804,487 A | | 9/1998 | Lammert |
| 5,804,877 A | | 9/1998 | Fuller et al. |
| 5,869,379 A | * | 2/1999 | Gardner et al. ............. 438/305 |
| 5,877,075 A | * | 3/1999 | Dai et al. ................... 438/597 |
| 5,906,911 A | * | 5/1999 | Cote .......................... 430/316 |
| 5,913,148 A | * | 6/1999 | Hills .......................... 438/701 |
| 5,935,762 A | * | 8/1999 | Dai et al. ................... 430/312 |
| 6,045,981 A | * | 4/2000 | Matsunaga et al. ......... 430/330 |
| 6,093,508 A | * | 7/2000 | Cote .......................... 430/11 |
| 6,107,177 A | | 8/2000 | Lu et al. |
| 6,288,442 B1 | * | 9/2001 | Farrar ........................ 257/678 |
| 6,380,006 B2 | * | 4/2002 | Kido .......................... 438/148 |
| 6,451,512 B1 | * | 9/2002 | Rangarajan et al. ........ 430/313 |
| 6,514,672 B2 | * | 2/2003 | Young et al. ............... 430/314 |

\* cited by examiner

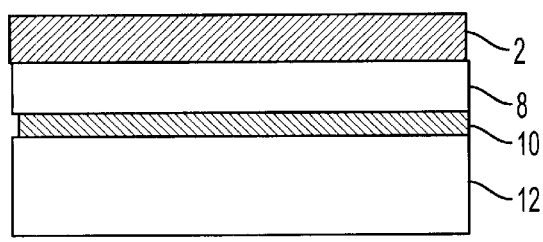
FIG. 1A
(PRIOR ART)
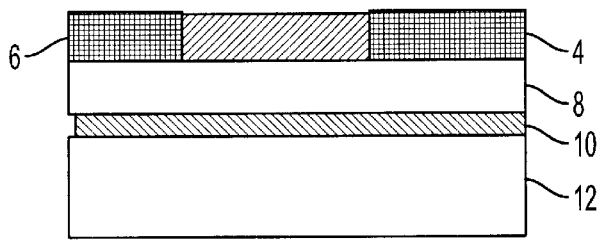
FIG. 1B
(PRIOR ART)
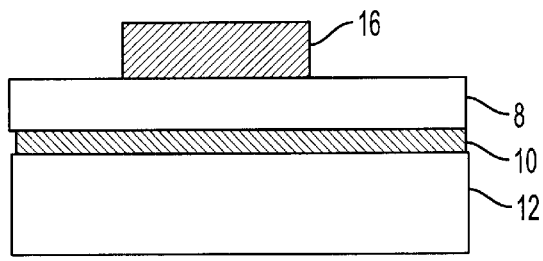
FIG. 1C
(PRIOR ART)
FIG. 1D
(PRIOR ART)
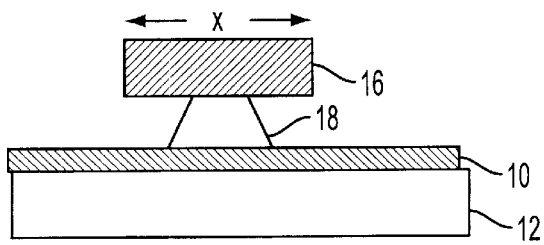
FIG. 1E
(PRIOR ART)
FIG. 1F
(PRIOR ART)
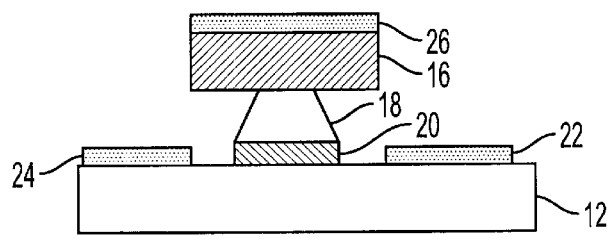
FIG. 1G
(PRIOR ART)
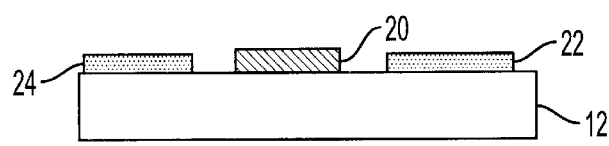

METHOD FOR THIN FILM LIFT-OFF PROCESSES USING LATERAL EXTENDED ETCHING MASKS AND DEVICE

BACKGROUND OF THE INVENTION

1. Field of the Invention

The present invention is directed to a method for thin film lift-off of metals using a laterally extended or "T" shaped etching (or etch) mask. In particular, a controllable lateral extension can be formed on the etching mask after an etching process has taken place. The etching mask with the lateral extension can be used for the deposition of a non-contiguous thin film of metal (or other material) on a substrate. The method of the present invention can be part of a process step during the fabrication of electronic devices such as integrated circuits.

2. Related Art

Integrated circuits, such as transistors (field effect transistors (FETs), high electron mobility transistors (HEMTs), metal-semiconductor field effect transistors (MESFETs), heterostructure bipolar transistors (HBTs), etc.), diodes, lasers and other circuits using patterned, aligned, and/or non-contiguous metals, can be formed on substrates by a variety of conventional processes.

For example, in a conventional subtractive etching process, a complete or continuous layer of metal is deposited on a substrate. The layer of metal then receives a coating of photoresist that is patterned lithographically using exposure and development techniques. The patterned photoresist serves as a protective material during the metal etching step where the unprotected metal is removed. The undesired metal is removed or etched away by conventional wet chemical etching processes, ion milling, and/or dry etching processes.

Another conventional fabrication method involves creating patterned thin metal layers on a substrate by utilizing overhanging structures. The overhanging structures define areas intended to remain free of metal during the metal deposition step. These protective overhanging structures receive a coating of metal that can be lifted off with metal remaining only in the areas unprotected by the overhanging structure.

For example, in one conventional method, shown in FIGS. 1A–1E, a patterned photoresist and dielectric can be utilized. In FIG. 1A, a photoresist 2 is deposited on a dielectric layer 8, which is deposited on a metal 10, which is deposited on a substrate 12. In FIG. 1B, the photoresist is exposed to radiation through a conventional photo-mask, exposing regions 4 and 6. Following development or removal of the exposed regions, the patterned structure 16 remains in FIG. 1C. A selective etchant is then used to remove the dielectric layer 8 in the uncovered regions. The dielectric can be "over" etched to reduce the dimensions of the dielectric such that the lateral dimension is less than the patterned photoresist 16 (i.e. the dimension x is less than the dimension x'). Another selective etchant can then be used to remove portions of the metal layer 10 where the dielectric material acts as an etching mask.

The above process creates a metal area 20 that can be used as part of a device, e.g., as a gate in a transistor structure. After this etch, a second metal deposition can be performed over the entire structure (see layers 22, 24, 26) as shown in FIG. 1F. Due to the presence of the overhanging structure 16, metals (22 and 24) are deposited on either side of layer 20 and are spaced away from 20, creating non-contiguous metal layers. The photoresist and dielectric can then be removed and the metal 26 atop the photoresist is lifted off. The final arrangement of metals are shown in FIG. 1G.

There are several problems with the aforementioned conventional process. The lateral dimension of the overhang is difficult to control to the degree required by conventional semiconductor manufacturing standards. The problem is compounded since the dielectric area under the patterned photoresist is not the same as the initial photo-mask dimensions. Thus, for example, the width of the line (x) shown in FIG. 1C in the unexposed area is not the equal to the width of the line (x') defined by structure 18 in FIG. 1D. The width of the metal line 20 is the result of an overetch that is typically difficult to control. This discrepancy is problematic since the dimensions of metal lines are critical in semiconductor fabrication technology.

In addition, there are various device fabrication designs that require portions of the substrate to be etched prior to the deposition of metal on either side of a patterned structure. The use of conventional etching processes to etch away these areas of the substrate can be problematic. For example, many chemical solutions, primarily acids and bases, that are used to etch semiconductor materials, remove the material preferentially along crystallographic directions. This lack of symmetry in the etch rate and profile in different directions in the etched material is undesirable. Most of the substrate materials used in the semiconductor industry are single crystal materials, which often preferentially etch at different rates along different crystal planes (e.g. silicon, gallium arsenide, indium phosphide, cadmium telluride, indium antimonide, plus all related combinations of group II and VI elements, and combinations of group III and V elements).

Two such example structures are shown in FIGS. 2A and 2B. These figures show overhanging photoresist layers 30 and 32, disposed on etched substrates 31 and 33, respectively. These figures illustrate the resulting features 34 and 35 with sloped substrate sidewalls. These sloped substrate sidewall profiles can be unsatisfactory when uniform patterning is desired on all features in all orientations. Similar unsatisfactory crystallographic profiles are often generated during dry etching when the process is primarily chemical in nature. The crystallographic nature of etching can lead to undesirable undercut that can limit the minimum feature sizes that can be created.

Non-crystallographic wet and dry chemical processes are also available for the material removal or etching step. In this case, material may be removed leaving a curved undercut profile such as that shown in FIG. 3. The degree of undercut is difficult to control as there is often a difference between the vertical and horizontal etching rates. A common result is a small "foot" or extended region at the base of the etched structure. The substrate in semiconductor devices is frequently comprised of multiple layers of epitaxial material, some of which are etched during device fabrication. At this "foot", epitaxial layers are exposed and there is a strong possibility of inducing a electrical short between layers when metal is deposited in these regions.

For example, as shown in FIG. 3, a semiconductor material can include vertically stacked epitaxial layers 41, 42, and 43 deposited on a substrate 40. During isotropic etching of layer 43 (which can be performed to create an emitter region in a HBT type device), recessed or undercut side walls 44 and 45 are formed with an extending "foot" at points 48 and 49. During deposition of contacts 46 and 47, the possibility of a short (e.g., between base contacts 46 and 47 and emitter 43) is very high. An example of such a conventional method of fabricating a heterostructure bipolar transistor using isotropic etching is described in U.S. Pat. No. 5,804,487. Thus, an isotropic dry etch capable of producing an undercut typically forms the described sidewall profile that resembles a scallop or half circle. This type of profile is sufficient to satisfy the requirements for metal lift-off but is often inadequate for separating the deposited metal from the active portion of the etched substrate or device.

SUMMARY OF THE INVENTION

Thus, what is needed is a more controllable method to create an overhanging structure in order to form non-contiguous thin metals on a substrate, where the spacing of contacts can be controlled and the likelihood of electrical shorts can be reduced or eliminated.

In view of the foregoing, it would be desirable to provide a method for thin film lift-off of metals using a laterally extended etching mask. According to one embodiment of the present invention, a method for forming an etching mask structure on a substrate comprises etching the substrate, laterally expanding the etching mask structure, and depositing a self-aligned metal layer that is aligned to the originally masked area. The etching can be isotropic or anisotropic. The self-aligned metal layer can be distanced from the original etching masked area based on the extent of the intentionally laterally expanded etching mask layer. Following metal deposition, the initial mask structure can be removed, thus lifting off the metal atop it.

The etching mask structure can be a resist and can be formed using conventional photolithography materials and techniques and can have nearly vertical sidewalls. The lateral extension can include a silylation technique of the etching mask layer following etching. The silylated structure forms an overhang used to prevent the subsequently deposited metal layer from being continuous. The method according to this embodiment can be used to form a semiconductor structure that includes a patterned feature having substantially vertical sidewalls (i.e., anisotropically etched) or one with curved shaped, sloping sidewalls (i.e. isotropically etched) and with metal spaced at a particular (or required) distance from the substrate feature. Material other than metal that can be deposited in a line of sight from the source to the substrate (e.g., polysilicon and the like) may also be utilized with this method.

According to a second embodiment, a method includes forming an etching mask structure on a substrate in an area where a first layer of metal has been previously deposited. The etching mask structure can be a resist formed with photolithography materials and techniques and can have nearly vertical sidewalls. The etching mask protects/shields the portion of the first metal layer disposed under the etching mask from being removed during a removal process. Substrate areas not protected by the etching mask (e.g., where the metal or material was removed previously) can then be etched (e.g., isotropically or anisotropically) with either a wet or dry etching chemistry.

The method according to this embodiment can also include laterally expanding the etching mask structure by silylating the resist layer or etching mask, where the silylating expands the resist layer in a lateral direction parallel to the substrate surface. A second metal layer is deposited and is self-aligned to the originally masked area. The self-aligned metal layer is thus distanced from the originally masked area based on the extent of the intentionally laterally expanded mask layer. Following metal deposition, the initial etching mask structure can be removed, thus lifting off the metal atop it.

The method according to this embodiment can be used to form a semiconductor structure that includes a patterned substrate feature having substantially vertical sidewalls (i.e. anisotropically etched) or one with curved shaped, sloping sidewalls (i.e. isotropically etched) and with metal spaced at a required distance from the substrate feature. Material other than metal that is typically deposited in a line of sight from the source to the substrate may also be deposited in this method.

Further features and advantages of the invention, as well as the structure and operation of various embodiments of the invention, are described in detail below with reference to the accompanying drawings.

BRIEF DESCRIPTION OF THE DRAWINGS

The accompanying drawings, which are incorporated herein and form part of the specification, illustrate, but do not limit, the present invention and, together with the description, further serve to explain the principles of the invention and to enable a person skilled in the pertinent art to make and use the invention.

FIGS. 1A–1G show a conventional fabrication process.

DETAILED DESCRIPTION OF THE INVENTION

The present invention is directed to a method that includes using a lateral extended etching mask to be employed in semiconductor device manufacturing. In particular, the method of a preferred embodiment of the present invention includes inducing a lateral expansion or volume change along the vertical sides (also referred to as sidewalls) of a patterned layer that serves as an etching mask. The etching mask structure produced in this manner has a profile with an "overhang" suitable for deposition of a non-contiguous thin film of metal or other suitable material used in semiconductor device fabrication (e.g. polysilicon).

Further, the underlying substrate can be removed with a suitable etching technique, such as anisotropic or isotropic etching. After material deposition, the etching mask with the metal layer or other deposited material on top of it is then removed causing the metal or other deposited material to "lift-off". Thus, the remaining metal or other deposited material is left on the recently etched areas of the substrate. By controlling the lateral extension of the overhang, the distance between the newly created etched structure under the etching mask and the deposited metal or other material can be intentionally manipulated. With this process, the likelihood of undesirable electrical shorts on the finished semiconductor device can be reduced.

A first preferred embodiment of the present invention includes a method of patterning an etching mask structure on a substrate, either isotropically or anisotropically etching the substrate, laterally extending the etching mask layer, and depositing a layer that is self aligned with the structure produced by the etching process. The etching mask layer can then be removed causing the deposited layer to be lifted off as a conventional lift-off process.

Figures 2A, 2B:
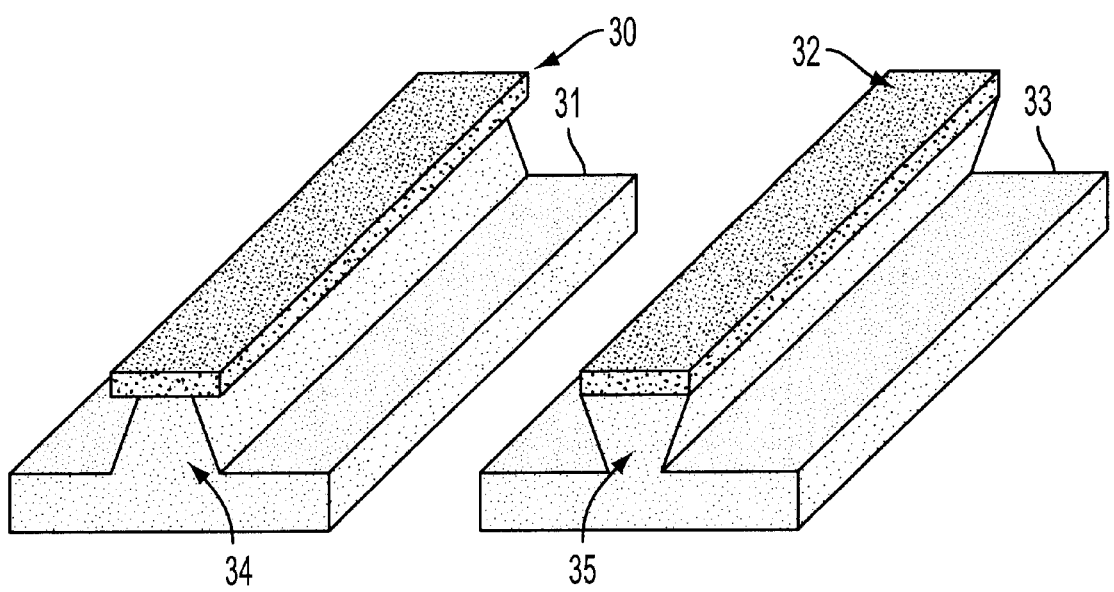
FIGS. 2A and 2B show the etching profiles of wafers etched with conventional wet etching techniques.
Figure 3:
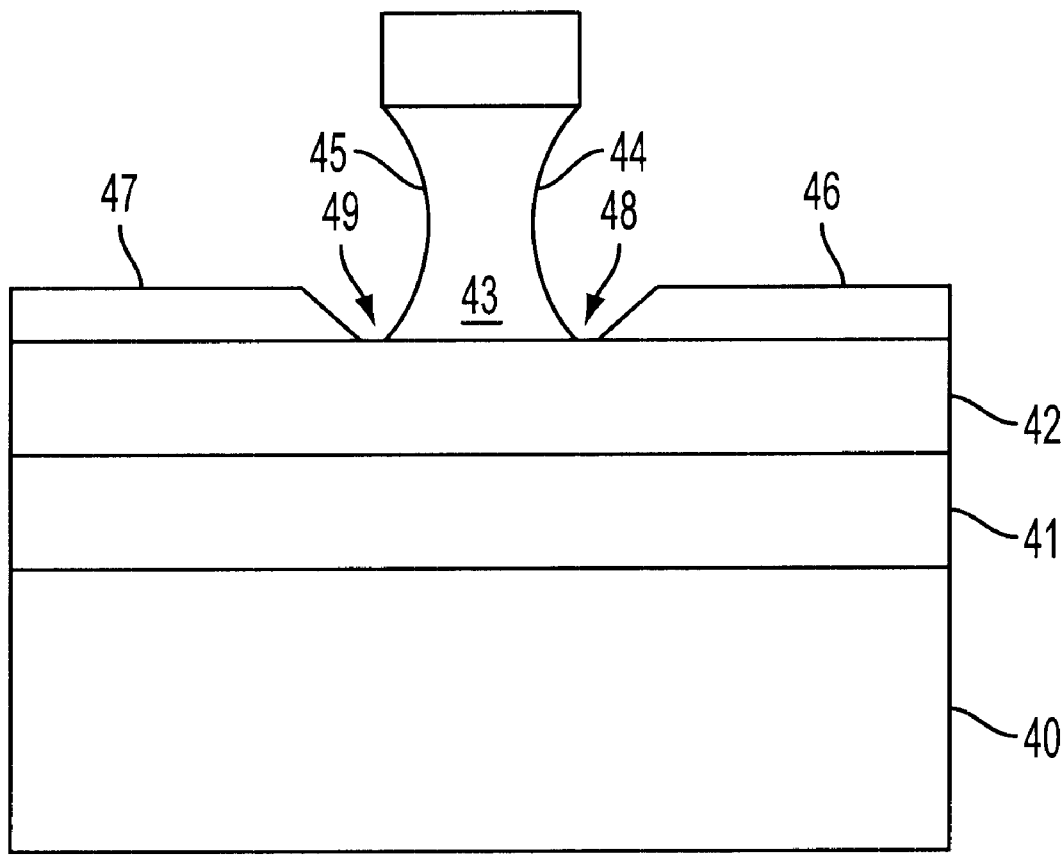
FIG. 3 shows an in-process structure with a transistor emitter region defined by an isotropic etch.
Figure 4:
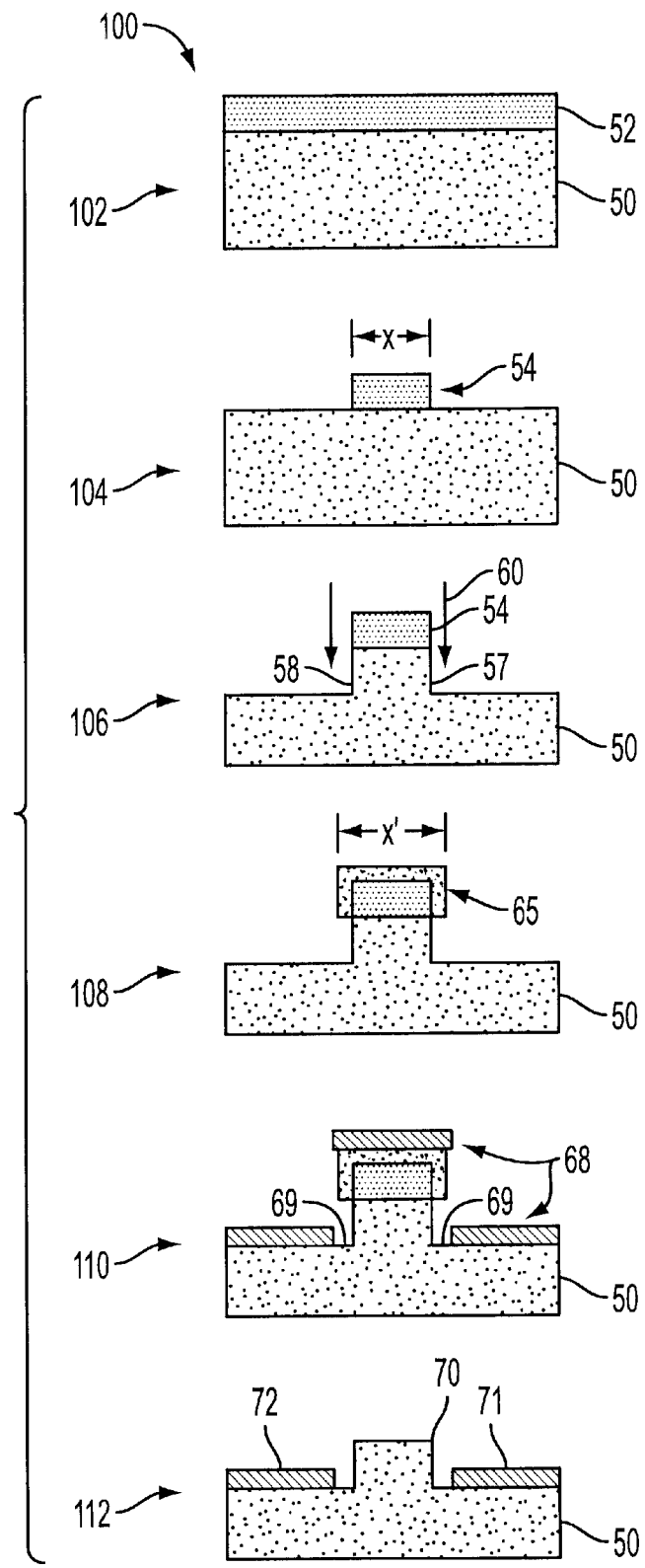
FIG. 4 shows a fabrication process according to an embodiment of the present invention.

FIG. 4 shows a schematic diagram of the fabrication process according to a first preferred embodiment of the present invention, where an overhanging mask structure 65 is created by controlling a lateral expansion of a masking layer 54. The masking layer 54 can comprise a material such as a photoresist, polymer, or organic material. In addition, an etching process 60 is used to etch the underlying substrate 50. The etching process 60 can be, for example, an isotropic or anisotropic dry etch. In one aspect of the invention, an anisotropic etch is utilized to produce a vertical or nearly vertical sidewall (about 70 to 90 degrees from the plane of the substrate). Steps 102–112 show various stages of an in-process structure 100.

In step 102, an etching mask layer 52 is formed over a substrate 50. Substrate 50 can comprise a substrate material with or without relevant layers of materials used in semiconductor or electro-optic devices. Example substrates include silicon, silicon dioxide, aluminum oxide, germanium, III–V compounds, II–VI compounds, GaN, silicon carbide quartz, sapphire, or combinations of like materials. Preferably, for many transistor devices such as HEMTs or HBTs, the substrate comprises a structure of horizontally stacked epitaxial semiconductor layers. Layer 52 preferably comprises a material such as a photoresist, a polymer, or other organic material layer, and has a thickness of about 0.7 to about 3 micrometers ($\mu$m).

In step 104, mask layer 52 is patterned to form an etching mask structure 54. In a preferred embodiment, layer 52 is a resist or suitable polymer or organic material that is photolithographically patterned and developed. For example, a master mask (not shown) can be imaged with reduction on the mask layer. The process of the present invention utilizes a self-alignment mechanism and thus, critical alignment to previously patterned layers is not necessary. Other patterning methods, such as laser patterning, or some other process (e.g. electron beam, ion beam, x-ray, or extreme ultraviolet), can be utilized as would be apparent to one of skill in the art given the present description.

In step 106, the substrate 50 is etched, where mask structure 54 acts as an etching mask. The etching mask is used to protect or shield a portion of the substrate from being etched. In a preferred aspect of this embodiment, an anisotropic dry etch 60 is used to etch substrate 50. Alternatively, isotropic and/or anisotropic etches, which may or may not result in vertical sidewall profiles, can be used. This etching includes both wet and dry etching methods. During a preferred anisotropic etch, nearly vertical (about 70 to 90 degrees from the plane of the substrate) sidewalls 57 and 58 are created underneath etching mask structure 54.

For example, suitable dry etch techniques that are considered anisotropic can include ion beam etching (IBE), reactive ion etching (RIE), reactive ion beam etching (RIBE), or combinations of techniques involving inductively coupled plasma etching (ICP), electron cyclotron resonance etching (ECR), and/or helicon etching. In a preferred aspect of this embodiment, a structure with the same or nearly the same lateral dimensions as the etching mask is produced. This preferred aspect is significantly different from the previous description of a conventional lift-off process where a required overetch causes the etch structure to have a dimension less than the originally patterned etching mask. Etching methods that generate isotropic profiles can also be utilized in this embodiment. Isotropic etching includes techniques such as wet etching, remote or downstream etching, and other gas phase etching configurations relying primarily on chemical rather than physically driven processes.

A particular example of an anisotropic etching process uses an ICP system with a superimposed RF (radio frequency) bias on the substrate. Etching can be performed with such a plasma etching system to remove a portion or all of one or more layers of substrate 50. This type of process can form straight, substantially anisotropic vertical sidewalls 57 and 58. The gases used in such a process or other appropriate processes, can be highly dependent on the materials used in layer 50.

The etching mask is still in place following etching of the substrate to the desired depth. The depth of etching is dependent on the devices being fabricated but can range in depth from a few hundredths of a micron to 3 $\mu$m, with a preferred etch depth being 0.1 to 0.3 $\mu$m.

Figure 6:
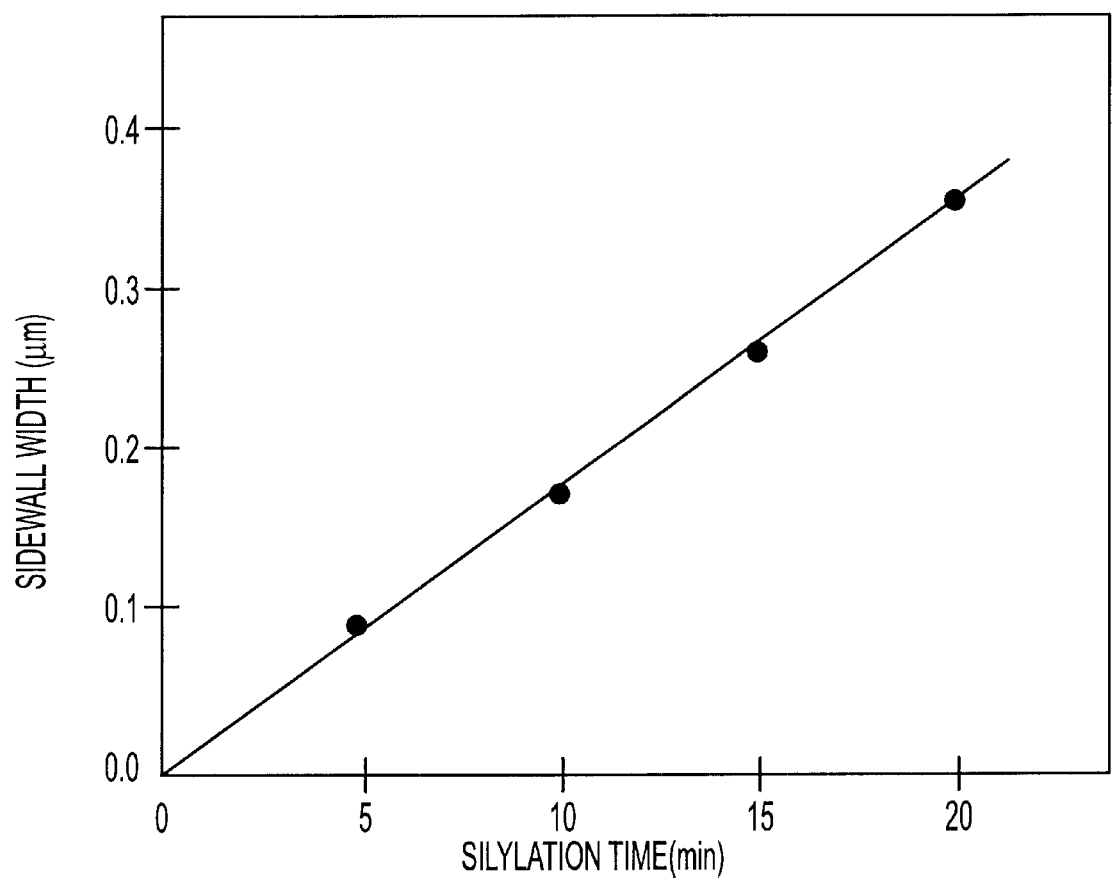
FIG. 6 shows a plot of silylation time versus sidewall width.

In step 108, the mask layer portion of etch mask 54 is laterally expanded to form an overhang structure 65 that has an increased lateral dimension (x') as compared to the lateral dimension (x) of mask structure 54. This step involves controllably enlarging the etching mask volume through an expansion process, such as silylation. Other physical and chemical means may also be used to increase the volume and create an overhang structure (e.g., solvent swelling), as will be apparent to those of skill in the art given the present description. Preferably, a silylation processes is utilized, so that the mask layer (e.g., photoresist, polymer, or organic material) is exposed to a silylating agent that causes a buildup of material on both the horizontal and vertical edges of the resist in a controlled manner. With the silylation process, the degree of volume enlargement, in particular the width (lateral dimension) of the overhang, can be controlled. For example, the distance between the etch structure and the metal remaining following lift off can be determined using the known relationship between sidewall width and silylation time that is shown in FIG. 6, and is described in U.S. Pat. No. 4,803,181.

The lateral expansion in mask layer volume is used as an overhang to shield the substrate 50 from deposition of a second material in the following process step. In step 110, a second layer 68 is deposited. Preferably, the second layer is a metal but can be other materials appropriate to the device being fabricated such as a polysilicon or a metal silicide. A preferred deposition process is a line-of-sight process onto the substrate, such as a thermal evaporation process or an electron beam evaporation process. Thus, under the expanded overhang structure 65, see e.g., areas 69, there is an absence of metal or other material deposition on the substrate 50. The deposited film is not continuous and is broken by the overhanging regions.

The overhang structure is removed in step 112. Preferably, removal step 112 comprises a lift-off process where the etching mask, including its expanded overhang portion and the metal or other material deposited on top of the etching mask, is removed. This step can be accomplished using a wet process that selectively dissolves the mask layer and expanded overhang portion. The layer atop the expanded overhang (e.g., metal layer or other material) is then floated away. For example, a dilute solution of buffered hydrofluoric acid will dissolve a silylated resist layer, allowing the remaining mask layer underneath to then be removed using a solvent such as acetone or isopropanol. Alternatively, the mask layer and overhang structure can be selectively removed in a dry etch chamber. Other lift-off techniques can be utilized as would be apparent to one of ordinary skill in the art given the present description.

After the lift-off process, the resulting structure 70, which can be referred to as a mesa, is controllably spaced apart from metal layers 71 and 72. Preferably, this spacing is about 0.1 $\mu$m to about 0.4 $\mu$m, with a preferred spacing of approximately 0.2 $\mu$m.

Figure 5:
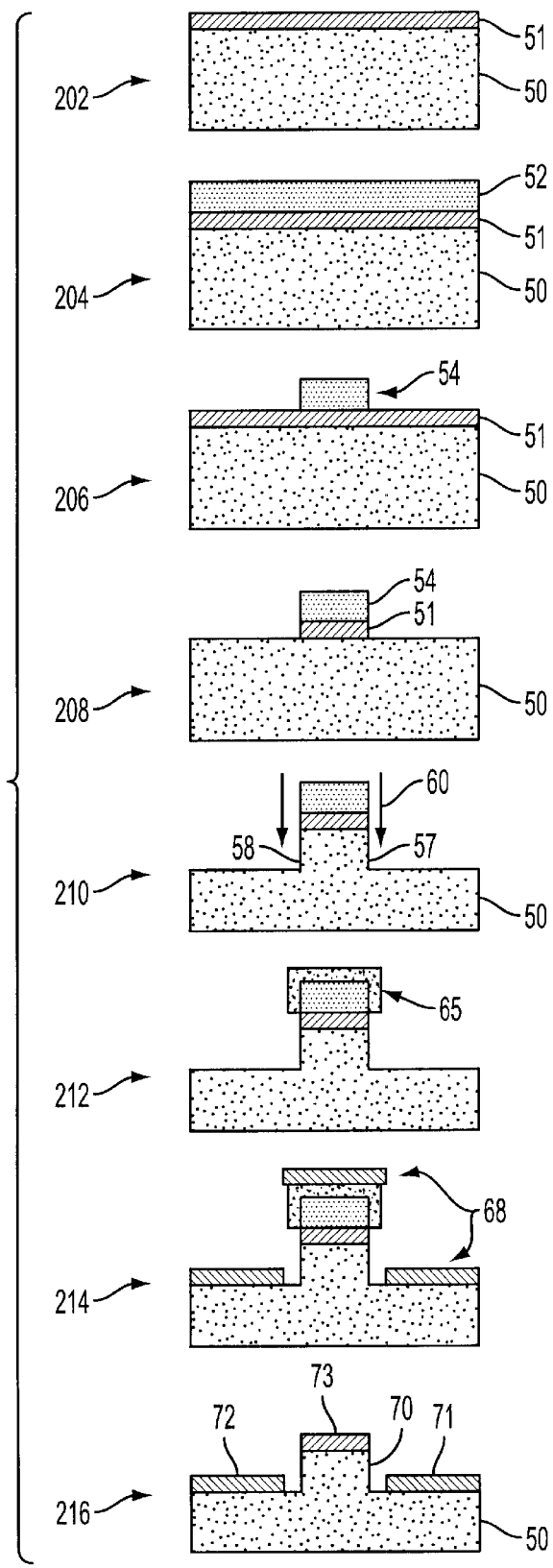
FIG. 5 shows a fabrication process according to another embodiment of the present invention.

A second preferred embodiment of the present invention is shown in FIG. 5. In step 202, a first layer 51 is formed over a substrate 50. As with the previous embodiment, substrate 50 can comprise a suitable substrate material used in semiconductor or electro-optic devices. First layer 51 can be a layer of semiconductor material or a metal. Preferably, layer 51 is a metal or other thin film (such as doped polysilicon, metal silicides, aluminum oxide, silicon oxide, silicon nitride, or combinations of films), having a thickness of about 0.1 $\mu$m to about 0.5 $\mu$m. Layer 51 can be formed on substrate 50 by any number of conventional deposition methods, such as MBE, sputtering, thermal evaporation, or the like.

In step 204, a mask layer 52 is formed on layer 51. Mask layer 52 is similar to that described above with respect to FIG. 4. In an alternative embodiment, a thin sacrificial layer (not shown) can be disposed between layer 51 and the etching mask layer 52, in order to protect the surface of layer 51 from contact with layer 52. An advantage of the preferred embodiments of the present invention is that a sacrificial layer is not required.

In step 206, mask layer 52 is patterned to form a mask structure 54 in a manner similar to that described above for step 104.

In step 208, layer 51 is patterned in an etching process, where the patterned mask structure 54 acts as an etching mask. The patterning of layer 51 can be accomplished using, for example, conventional wet or dry etch techniques. In a preferred aspect, the remaining area of layer 51 faithfully represents the lateral dimensions of the patterned 54 layer. In this embodiment, mask structure 54, thus patterned, can be utilized as a gate contact for various devices such as bipolar transistors, HBTs, HEMTs, and MESFETs.

In step 210, the substrate 50 is etched, where mask structure 54 acts as an etching mask and protects/shields a portion of the substrate to be etched. In a preferred aspect of this embodiment, an anisotropic dry etch 60 is used to etch substrate 50. Alternatively, isotropic and/or anisotropic etches, which do not result in vertical profiles, can be used. This includes both wet and dry etching methods. During the preferred anisotropic etch, substantially vertical sidewalls 57 and 58 are created underneath mask structure 54. The etching processes used in step 210 are similar to those described above for step 106.

The etching mask 54 is still in place following etching of the substrate to the desired depth. In step 212, the mask layer portion of etch mask 54 is laterally expanded to form an overhang structure 65, that has an increased lateral dimension as compared to mask structure 54. The expansion processes used in step 212 are similar to those described above for step 108. The lateral extension of the etching mask determines the distance between the etched structure and the material deposited in the following step.

In step 214, a layer 68 is deposited. Preferably, layer 68 is a metal however it can be other material or materials used in device fabrication. such as a polysilicon or a metal silicide. A preferred deposition process is a line-of-sight process, such as a thermal or electron beam evaporation processes, similar to that described above with respect to step 110.

The overhang structure 65 is removed in step 216. Preferably, the removal step comprises a lift-off process where the etching mask, including its expanded overhang portion and the metal deposited on top of the overhang, is removed, similar to the process described above with respect to step 112.

After the lift-off process, the resulting structure 70, which can be referred to as an etched structure or a mesa, is controllably spaced apart from metal layers 71 and 72, and further includes layer 73, which is the remaining portion of original layer 51.

Figure 7A:
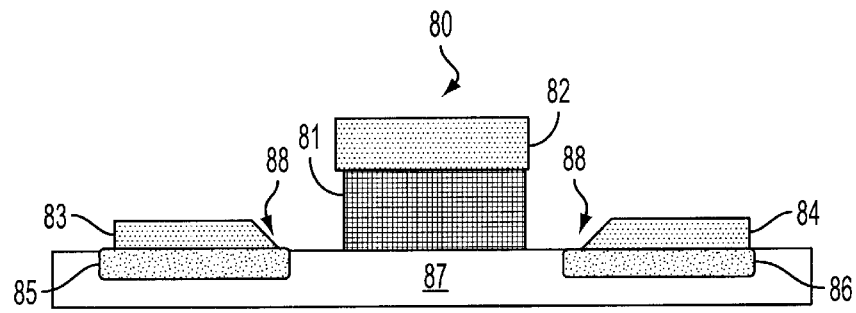
FIG. 7A schematically shows a MESFET structure having a self-aligned gate contact that can be formed with the second embodiment of the present invention.
Figure 7B:
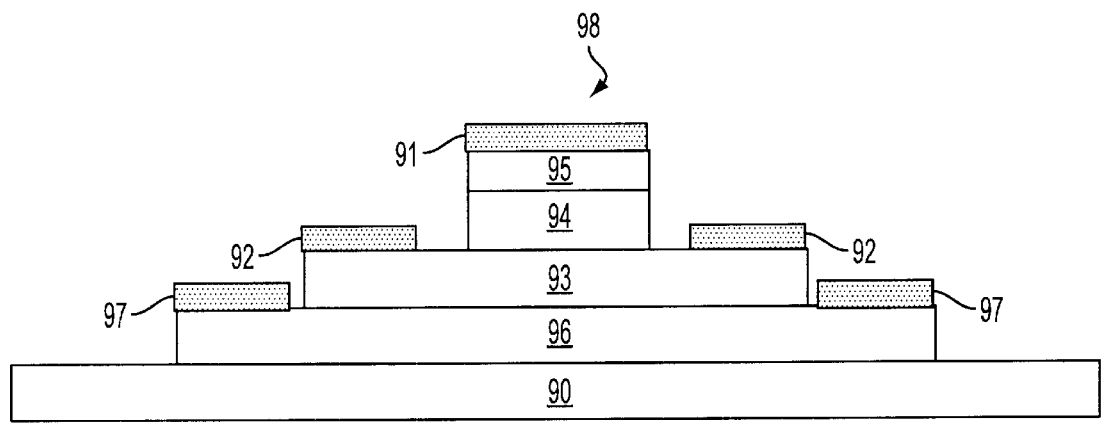
FIG. 7B schematically shows a HBT device with both a self-aligned emitter contact and a self-aligned base contact that can be formed by the method embodiments of the present invention.

The resulting structures shown in FIGS. 4 and 5 can be further refined to resemble semiconductor devices 80 and 82, shown in FIGS. 7A and 7B, respectively.

For example, FIG. 7A shows a MESFET structure having a self-aligned gate contact that can be formed by the processes described above in the second embodiment. MESFET 80 can include a semiconductor substrate 85, such as gallium arsenide or indium phosphide. and a semiconductor material layer 86, such as doped gallium arsenide. Contacts 83 and 84, which represent the source and drain, respectively) are deposited as discussed above. Device 80 further includes a mesa 87, having substantially vertical sidewalls, and a gate electrode 88, disposed on the top surface of mesa 87. In this process approach, the distances between the mesa and the two contacts (source and drain) and the distance between the source and drain are established by the extent of the lateral overhang. The etching mask forms a mesa structure midway between the source and drain because the overhang dimensions (laterally) are equal on either side.

Alignment tolerances in many devices are exceedingly small, approaching sub 0.1 micron dimensions, and thus alignment can be a significant issue in a manufacturing process. Thus, an advantage of the above embodiments of the present invention is that the conventional requirement for alignment of the gate between the source and drain is not necessary.

Another advantage of the above embodiments of the present invention is the distances between the gate and source contacts and the gate and drain contacts can be made very small, on the order of 0.1 to 0.2 $\mu$m. . Additionally, because conventional deposition processes create a sloping structure 89 on contacts 83 and 84, the controlled spacing of the mesa 87 from contacts 83 and 84 described in the above preferred embodiments helps reduce the likelihood of electrical shorting.

Figure 10A:
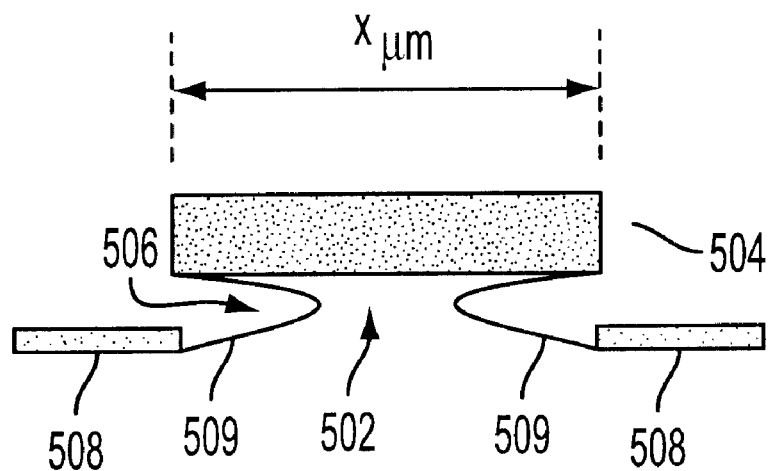
FIG. 10A shows an etching structure formed using a conventional etch.
Figure 10B:
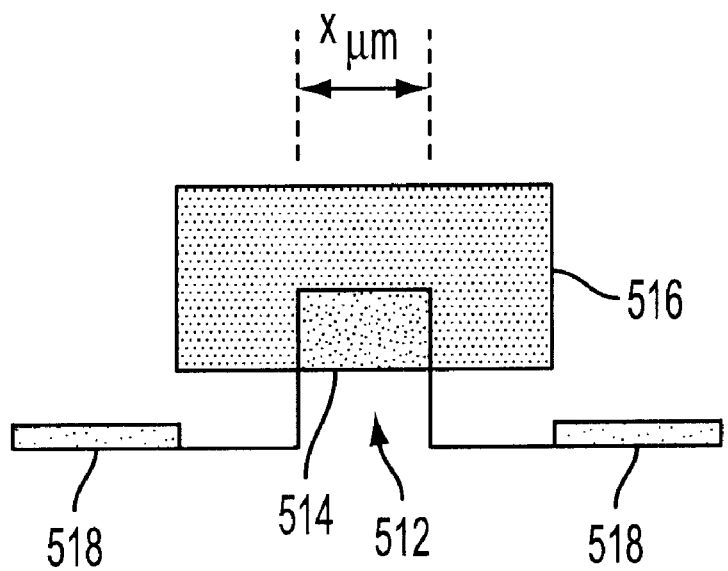
FIG. 10B shows an exemplary etching mask according to an exemplary fabrication process according to an embodiment of the present invention.

For example, as shown in FIG. 10A, using a conventional etching process, such as wet chemistry, the undercut structure 502 underlying resist layer 504 can have a recessed shape, with a "waist" 506. Because conventional wet etching can be difficult to control, the waist area 506 can be significantly narrower in a lateral dimension than the areas of structure 502 above and below the waist. This shape can impair the structural integrity of structure 502 and limits the initial feature dimension, "x". Further, the likelihood is increased that deposited layers 508 can contact structure 502 at foot regions 509. In contrast, as shown in FIG. 10B, using the process according to a preferred embodiment of the present invention, the structure 512 can more resemble a "mesa" under a laterally expanded resist layer 514. By avoiding an undercutting isotropic etch, the etched feature can have greater structural integrity. In this example, the lateral dimension of structure 512 can remain approximately constant and more closely replicate the dimension patterned during the photolithography process. Accordingly, the method of the embodiments of the present invention better facilitate small dimensioned features and spacing for deposited metal layers 518.

FIG. 7B shows a HBT device 98 having a self-aligned base contact, 92, that can be formed by the processes described above. HBT 98 can include layers of semiconductor materials with appropriate electronic and material characteristics. The materials for HBT devices are well known and can be binary, ternary and quaternary combinations of the periodic table Group III and V compounds. Common HBT material systems include GaAs/AlGaAs, AlInAs/InGaAs, and InP/InGaAs.

Using the InP/InGaAs system as an example with respect to the structure shown in FIG. 7B, the semiconductor substrate 90 can be InP, a suitably doped collector 96 can be a particular InGaAs composition, a suitably doped base 93 can be a particular InGaAs composition, and a suitably doped emitter 94 can be InP. A cap layer 95 (optional) can also be included and can comprise a particular composition of InGaAs.

Contacts 91, 92, and 97 are metal contacts deposited in accordance with the metal deposition techniques described above. Different emitter, base, collector, and substrate compositions can also be utilized, would be apparent to those of skill in the art given the present description.

Figure 7C:
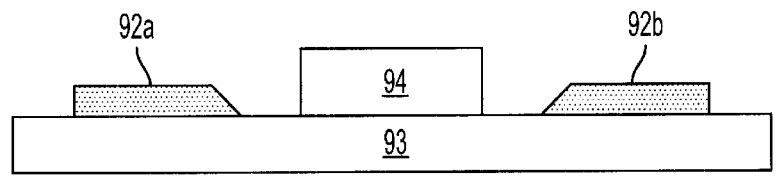
FIG. 7C schematically shows a close up view of the contact spacing of the HBT device of FIG. 7B.

A close-up diagram of the structure of base contacts 92a and 92b and emitter 95 is shown in FIG. 7C. According to a preferred embodiment of the present invention, a HBT includes an emitter with vertical sidewalls, thus reducing the potential for an electrical short between the emitter and the base contacts. However, the embodiments described herein do not require vertical profiles for the emitter. The overhang created by silylation following etching can reduce the need for such vertical profiles.

One difference between the preferred fabrication methods discussed above with respect to FIGS. 4 and 5 is the process stage in which a metal is formed on top of the etched structure as in a diode or transistor type device. In FIG. 4, the final structure 70 does not have metal on the etched structure. The embodiment shown in FIG. 5 allows a metal or other thin film (such as doped polysilicon, aluminum oxide, silicon oxide, silicon nitride, or combinations of films) to be placed on the area to be etched prior to forming the etch mask structure. Using the process shown in FIG. 4, additional metal layers can be added subsequent to forming the etching mask structure.

Figure 8:
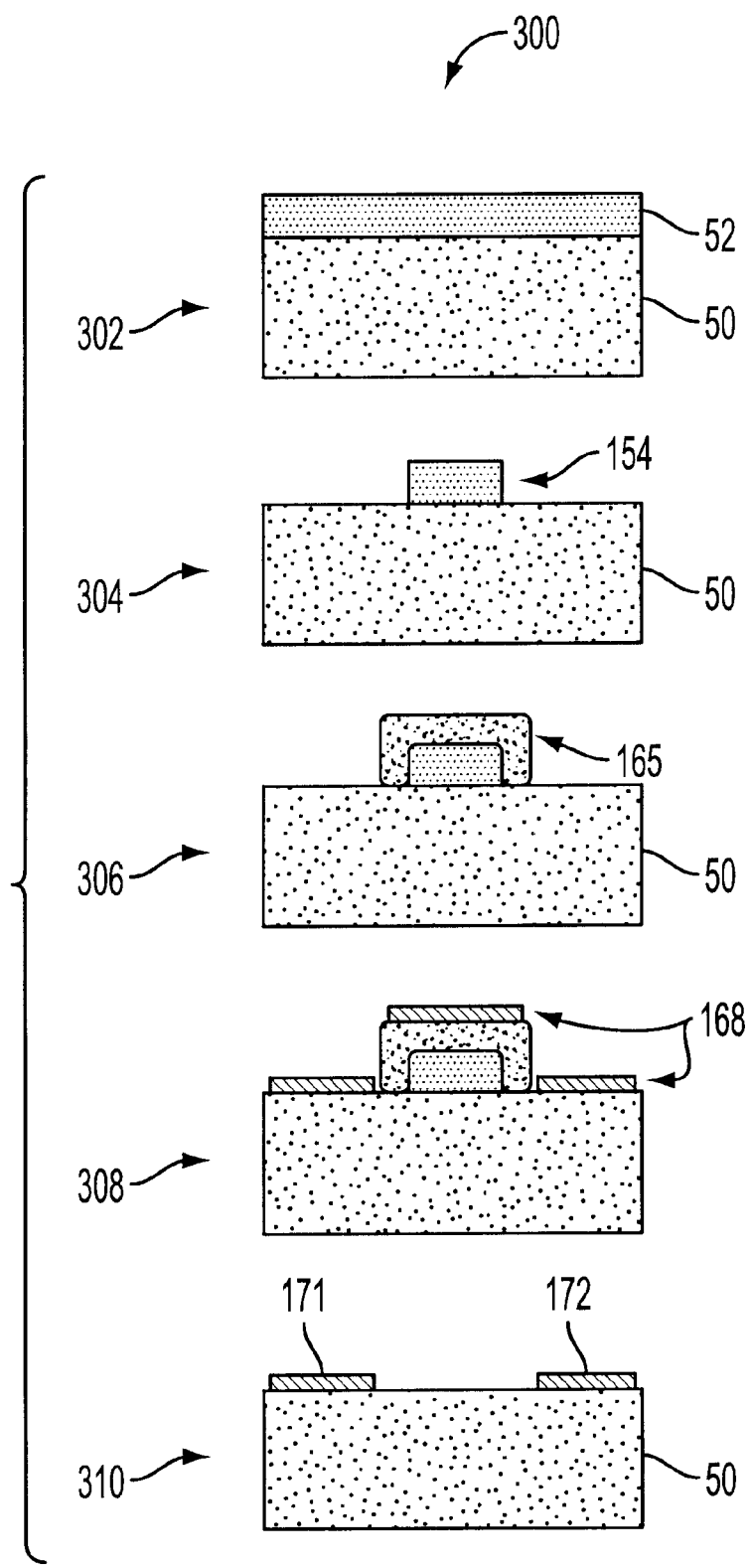
FIG. 8 shows an alternative fabrication process according to an alternative embodiment of the present invention.
Figure 9:
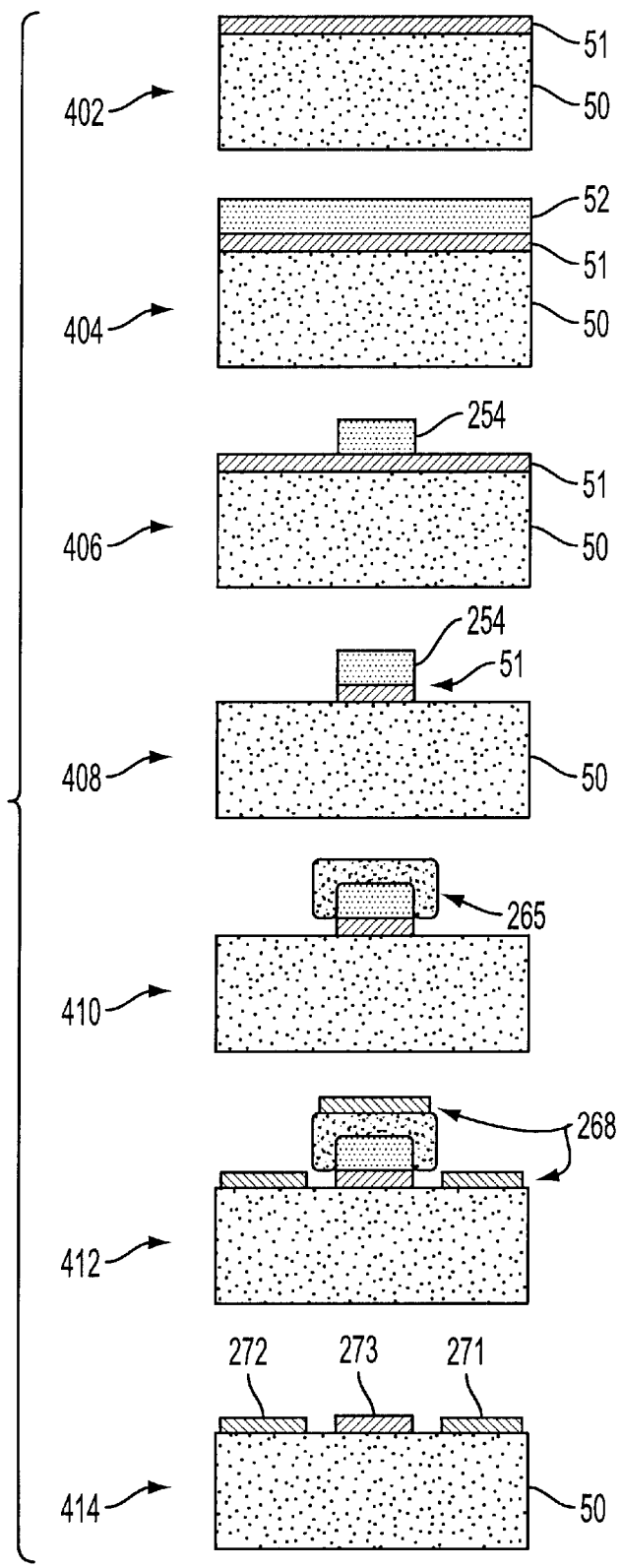
FIG. 9 shows another alternative fabrication process according to another alternative embodiment of the present invention.

Alternative embodiments of the fabrication method according to the present invention are shown in FIGS. 8 and 9.

FIG. 8 shows an alternative process 300 which can be used to controllably space contacts 171 and 172 on a semiconductor substrate. An expanded mask structure 165 is created by controlling a lateral expansion of a masking layer 154, such as a photoresist, polymer, or organic material.

In step 302, a mask layer 52 is formed over a substrate 50, in a manner similar to that described above with respect to step 102 shown in FIG. 4. The mask layer and substrate can comprise the materials described previously with respect to FIG. 4. In step 304, mask layer 52 is patterned to form a mask structure 154, in a manner similar to that described above with respect to step 104 shown in FIG. 4.

In step 306, the mask layer portion of etch mask 154 is laterally expanded to form an structure 165, that has an increased lateral dimension as compared to mask structure 54. This step involves controllably enlarging the etch mask volume through an expansion process, such as silylation or heat treatment, which were described previously with respect to step 108. Preferably, a silylation processes is utilized, so that the mask layer (e.g., photoresist, polymer, or organic material) is exposed to a silylating agent that causes a buildup o f material on both the horizontal and vertical edges of the resist in a controlled manner. With the silylation process, the degree of volume enlargement or width (lateral dimension) of the overhang can be controlled.

The lateral expansion in mask layer volume is used to shield the substrate 50 from deposition of a second material in the following process step. In step 308, a second layer 168 is deposited. The composition of layer 168 and the manner in which layer 168 is deposited is similar to that described above with respect to layer 68 and step 110 shown in FIG. 4. In this alternative embodiment, deposition step 108 should be made as directional as possible to minimize an amount of metal being deposited on the sides of structure 165, such that only the horizontal surfaces (i.e., of substrate 50) receive metal and not the vertical or sidewall surfaces. Otherwise, subsequent lift-off of structure 165 will be more difficult.

The structure 165 is removed in step 310 in a lift-off process similar to step 112 described previously.

A further alternative embodiment is shown in FIG. 9. In step 402, a first layer 51 is formed over a substrate 50. As with the previous embodiments, substrate 50 can comprise a suitable substrate material used in semiconductor or electro-optic devices. First layer 51 can be a layer of semiconductor material or a metal, such as those described previously with respect to FIG. 5.

In step 404, a mask layer 52 is formed on layer 51. Mask layer 52 is similar to that described above with respect to FIG. 4.

In step 406, mask layer 52 is patterned to form a mask structure 254 in a manner similar to that described above for step 104.

In step 408, layer 51 is patterned in an etching process, where patterned mask structure 254 acts as an etch mask. The patterning of layer 51 can be accomplished using, for example, wet or dry etching techniques.

In step 410, the mask layer portion of etching mask 254 is laterally expanded to form an overhang structure 265, that has an increased lateral dimension as compared to mask structure 54. The expansion processes used in step 410 are similar to those described above for step 108.

In step 412, a layer 268 is deposited. Preferably, layer 268 is a metal. A preferred deposition process is a line-of-sight process, such as a thermal evaporation process, similar to that described previously with respect to step 110.

The overhang structure 265 is removed in step 414. Preferably, the removal step comprises a lift-off process where the etching mask, including its expanded overhang portion and the metal deposited on top of the overhang, is removed, similar to the process described above with respect to step 112.

After the lift-off process, the contact 273 is controllably spaced apart from contacts 272 and 271.

Thus, the separation distance between the metal contacts can be modified by a lateral expansion technique, such as silylating the photoresist, polymer, or organic etch mask material. By being able to achieve the overhang profile without etching the substrate material, as is described with respect to the embodiments shown in FIGS. 8 and 9, the minimum width of the structure can be reduced. For example, if 0.2 μm of undercut was necessary to achieve acceptable distance between the deposited metal and the etch structure, then the minimum orginal structure would need to be significantly greater than 0.4 μm. This undercut creation can greatly limit the device size technology.

FIGS. 10A and 10B show the difference between conventionally etching an undercut (FIG. 10A) and a preferred embodiment (FIG. 10B). In FIG. 10A the width of the initially patterned feature is significantly larger than the etched structure in FIG. 10B. An the smaller structure available with the embodiments described herein is advantageous to many devices in the microelectronics field. With each of the embodiments described herein, device scaling is limited by lithography, not by etch undercut using isotropic etching processes or alignment limitation. Thus, the shape of the structure can be made with greater control.

In addition, the embodiments described herein can avoid problems associated with the directionality of pattern orientation relative to the crystallographic axis.

As discussed previously, a primary application of the processes described herein is for semiconductor devices and integrated circuits, such as the examples shown in FIGS. 7A–7C. In particular, the above processes can be utilized in what are known as "self-aligned" processes for transistors and diodes. They are known as self-aligned, since a separate lithography step with alignment is not required. The alignment refers to the orientation between areas in the device (e.g. between gate and source/drain in a FET, or between emitter and base or between base and collector for a vertical structure bipolar transistor).

Thus, the embodiments of the present invention can be used as a method of forming bipolar, hetero-bipolar, or field effect transistors or other structures or devices utilizing a self-aligned lift-off process. An etch mask structure patterned on a semiconductor layer or layers including materials such as silicon, GaAs, InP, or other combinations of group IV, group III–V or II–VI materials or other materials used in device fabrication (such as GaN or SiGe). Subsequent isotropic or anisotropic etching with either with wet or dry chemistry to remove unprotected substrate material forms a three dimensional feature on the surface of the substrate. Laterally extending the etching mask or resist layer creates an overhang that can be used for the self-alignment of an ensuing blanket deposited layer (e.g., metal or polysilicon). The blanket layer is formed in a non-continuous manner due to the overhang of the etching mask. Removal in solvent of the etching mask with either wet or dry processes completes the process scheme.

Similarly, the embodiments of the present invention provide a method of forming bipolar, hetero-bipolar, or field effect transistors or other structures or devices utilizing a self-aligned lift-off process where a metal layer and/or other material(s) are preferentially protected by the etching mask or resist structure. An etch mask structure patterned on a metal or polysilicon on top of semiconductor layer or layers including materials such as silicon, GaAs, InP, or other combinations of group IV, group III–V or II–VI materials or other materials used in device fabrication (such as GaN or SiGe). Following removal of the metal layer or other materials with a wet or dry etching process the substrate layer or layers are removed to a desired depth, again with a wet or dry etch chemistry. The etching mask is then laterally extended using a silylating step and an overhand is created. The subsequently deposited metal or other material is then be self-aligned to the etched structure. Using a wet or dry chemistry the metal or materials atop the etch structure is removed. Hence, metal or other materials are spaced a defined distance from the etched structure and the material previously deposited on top of the etch structure.

The above embodiments can be further utilized to form photodiodes, stripe lasers, VCSELs (vertical cavity surface emitting lasers), modulators, waveguides, and other structures that can benefit from a self-aligned step, as would be apparent to one of ordinary skill in the art given the present description.

While the invention has been described in detail and with reference to specific embodiments thereof, it will be apparent to one skilled in the art that various changes and modifications can be made therein without departing from the spirit and scope of the invention. Thus, the breadth and scope of the present invention should not be limited by any of the above-described exemplary embodiments.

What is claimed is:

1. A method of forming a lift-off structure on a substrate, comprising:

imaging and developing a photoresist on the substrate;

anisotropically etching the substrate to form a vertical sidewall that is about 70 to about 90 degrees from the plane of the substrate;

controllably expanding the imaged and developed photoresist; depositing a self-aligned metal layer on the substrate that is aligned to the expanded imaged and developed photoresist; and lifting off the metal layer deposited on the imaged and developed photoresist, wherein the remaining self-aligned metal layer deposited on the substrate is spaced from the imaged and developed photoresist based on an amount of the expanding of the imaged and developed photoresist.

2. The method according to claim 1, wherein the controllably expanding step comprises silylating the imaged and developed photoresist.

3. The method according to claim 1, wherein the substrate comprises a first material and a second material formed over the first material, wherein the second material is selected from the group consisting of metals, doped polysilicon, metal silicides, aluminum oxide, silicon oxide, and silicon nitride, and wherein the photoresist comprises a third material selected from the group consisting of photoresists, polymers, and organic materials, that is disposed over a portion of the second material that corresponds to the imaged and developed photoresist, and further comprising:

patterning the second material prior to the etching step, wherein a portion of the second material remains below the imaged and developed photoresist as a result at the patterning.

4. The method according to claim 1, wherein the anisotropically etching step is performed prior to the controllably expanding step.

* * * * *